United States Patent

Uchiyama et al.

[11] Patent Number: 5,928,422
[45] Date of Patent: Jul. 27, 1999

[54] REGULATING CYLINDER UNIT IN A SINGLE-CRYSTAL PULLING APPARATUS AND A JIG FOR INSTALLING THEM

[75] Inventors: Teruhiko Uchiyama; Yoshiyuki Suzuki; Kazuyoshi Date, all of Kanagawa, Japan

[73] Assignee: Komatsu Electronic Metals Co., Ltd., Kanagawa, Japan

[21] Appl. No.: 09/037,056

[22] Filed: Mar. 9, 1998

[30] Foreign Application Priority Data

Mar. 7, 1997 [JP] Japan .................................. 9-052890

[51] Int. Cl.$^6$ .................................................. C30B 35/00
[52] U.S. Cl. ............................................ 117/217; 117/218
[58] Field of Search .............................. 117/18, 200, 213, 117/217, 218

[56] References Cited

U.S. PATENT DOCUMENTS 5,363,796 11/1994 Kobayashi et al. ...................... 117/30
5,720,810 2/1998 Arai et al. ............................... 117/221
5,853,480 12/1998 Kubota et al. .......................... 117/217

FOREIGN PATENT DOCUMENTS 6144986 5/1994 Japan .
726777 1/1995 Japan .

Primary Examiner—Felisa Garrett
Attorney, Agent, or Firm—Sughrue, Mion, Zinn, MacPeak & Seas, PLLC

[57] ABSTRACT

Regulating cylinder unit is divided into three parts, a third regulating cylinder shaped essentially like a cylinder and installed on the protection cylinder; a first regulating cylinder and a second regulating cylinder which are shaped like reversed truncated cones with different diameters and are capable of engaging with the third regulating cylinder. In addition, the second and third regulating cylinders are brought together in a preset ordering, that is, a flange formed at the outer peripheral rim of the upper end of the second regulating cylinder is engaged with a stepped portion of the third regulating cylinder, and a flange formed at the outer peripheral rim of the upper end of the first regulating cylinder is engaged with a flange formed at the inner peripheral rim of the lower end of the second regulating cylinder.

7 Claims, 6 Drawing Sheets

REGULATING CYLINDER UNIT IN A SINGLE-CRYSTAL PULLING APPARATUS AND A JIG FOR INSTALLING THEM

BACKGROUND TO THE INVENTION

1. Field of the Invention

The present invention relates to a regulating cylinder unit installed in a silicon single-crystal pulling apparatus employing the Czochralski Method (CZ method), and relates to a jig for installing the regulating cylinders. The regulating cylinders can be used for the large charging and proper melting of polycrystalline silicon.

2. Description of Related Art

It is known that regulating cylinders (heat shielding cylinders) concentrically surrounding a single crystal being lifted can be used in silicon single-crystal pulling apparatuss to increase the lifting speed of single crystals and to avoid single-crystal dislocation induced by impurity contamination.

However, when polycrystalline silicon (the raw material of silicon single crystal) has to be fed into a quartz crucible in a situation wherein regulating cylinders have been installed in a silicon single-crystal pulling apparatus, the regulating cylinders become an obstacle to feeding operations. Therefore, the amount of raw material fed into the quartz crucible is smaller than the amount that can be fed into a quartz crucible that has not had regulating cylinders installed as above, and the productivity is thus low. Two methods of dealing with this drawback were proposed. These were: (a) dividing the regulating cylinders into two parts and raising one part of the regulating cylinders when feeding raw material (for example, Unexamined Japanese Patent Publication (kokai) No. Hei. 6-144986) as shown in FIG. 6, and (b) dividing the regulating cylinders into two parts, and raising one of the regulating cylinders so as to raise the other part of the regulating cylinders when feeding raw material (for example, Unexamined Japanese Patent Publication (kokai) No. Hei. 7-267777) as shown in FIG. 7.

However, in the above-mentioned (a) method, even if the amount of raw material fed into the quartz crucible is increased, the relevant part of the regulating cylinders near the crucible can not be raised. This has a detrimental effect on the melting environment of raw material. In the above-mentioned (b) method, the part of the regulating cylinders near the crucible can be raised, but in the process the regulating cylinders are raised in their entirety above the heater, so crucible cannot be raised, too. This increases the amount of electric power required by the melting operations and hindered the crystallization of single crystals due to quartz deterioration. In addition, there existed a danger that impurities may enter the melted liquid stored in the crucible due to the frictional movements occurring between the regulating cylinders.

SUMMARY OF THE INVENTION

It is an object of the present invention to provide a regulating cylinder unit and a jig for installing them capable of avoiding frictional movements between regulating cylinders so that impurities can be prevented from entering into the melted liquid during the installation of the divided regulating cylinders, enhancing the ratio of single-crystallization, and having more possibilities to design regulating cylinders.

According to the present invention, the regulating cylinders (heat shielding cylinders), concentrically surrounding the semiconductor single crystal within a semiconductor single-crystal pulling apparatus, are divided into at least one outer cylinders and at least one inner cylinder, and the lower end of the outer cylinder is capable of engaging with the upper end of the inner cylinder.

Specifically, the method for engaging the outer cylinder with the inner cylinder involves, for example, engaging a flange formed at the inner peripheral rim of the lower end of the outer cylinder with a flange formed at the outer peripheral rim of the upper end of the inner cylinder. Furthermore, the outer cylinder and the inner cylinder are shaped in such a way that their measurements become smaller (for example, in the shape of a reversed truncated cone) when approaching their lower ends. Therefore, it is difficult for the outer cylinder and the inner cylinder to come into contact with each other.

According to this invention, installing the regulating cylinders to a single-crystal pulling apparatus is performed with the aid of a regulating cylinder-installing jig. The regulating cylinder-installing jig is provided with a plurality of hooks, and each hook is provided with at least two regulating cylinder-retaining portions each capable of respectively retaining the lower ends of the outer cylinder and the inner cylinder. The hooks are capable of extending or shrinking in radial directions so as to retain the regulating cylinders. By this arrangement, a plurality of regulating cylinders can be retained at the same time.

Specifically, the regulating cylinder-installing jig is composed of a dummy seed capable of being fixed to a seed chuck; and a plurality of hooks, made of heat-endurance metal or ceramic materials, the hooks being swingably suspended at the lower end of the dummy seed through a heat-endurance cable, each hook being provided with at least two recesses or protrusions for respectively retaining the lower ends of the divided regulating cylinders at preset locations.

BRIEF DESCRIPTION OF THE DRAWINGS

The present invention can be more fully understood by reading the subsequent detailed description and examples with reference made to the accompanying drawings, wherein.

DETAILED DESCRIPTION OF THE PREFERRED EMBODIMENTS

Figure 1:
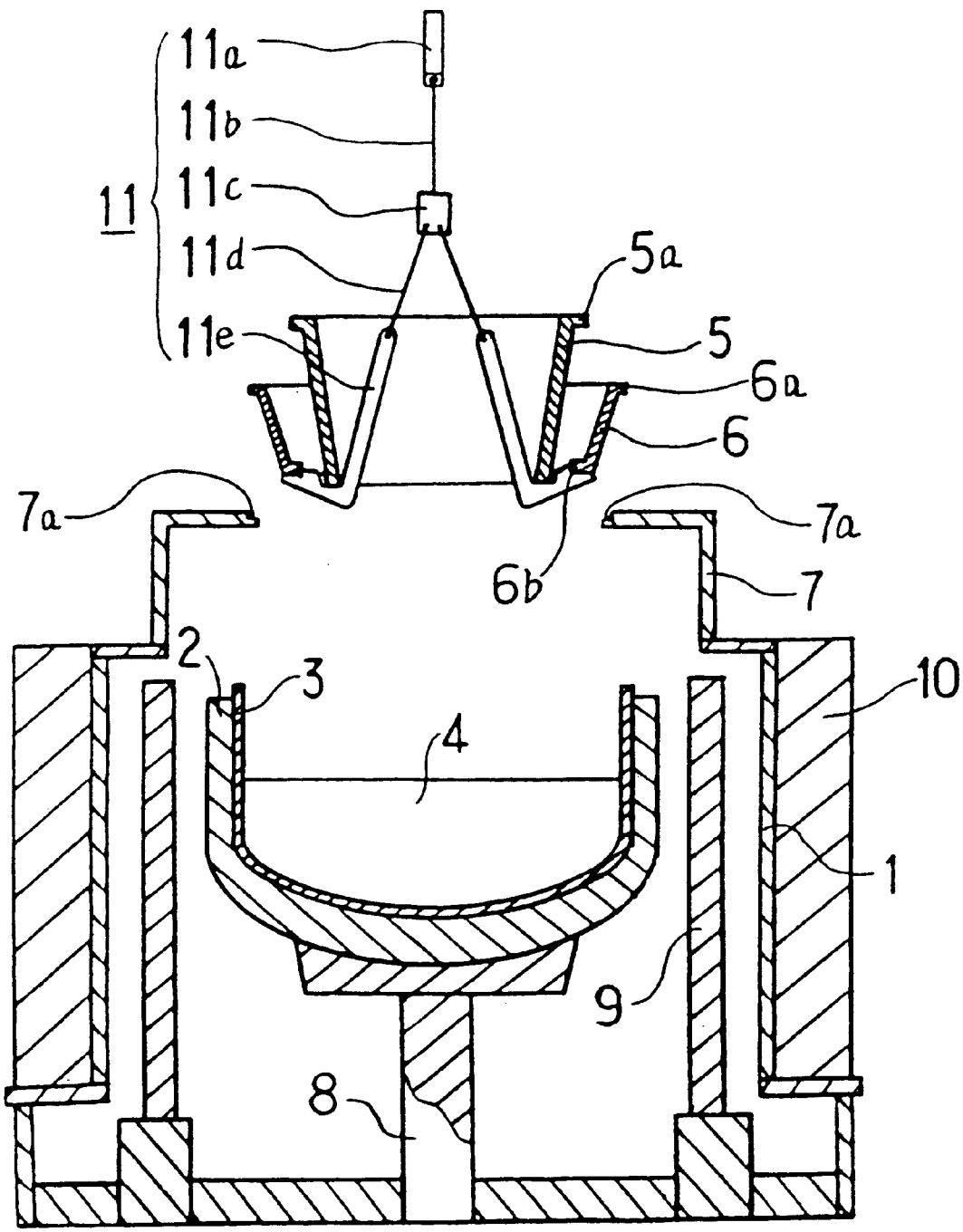
FIG. 1 is a schematic drawing showing the situation prior to the installation of regulating cylinders on to a device for lifting single crystals.
Figure 2:
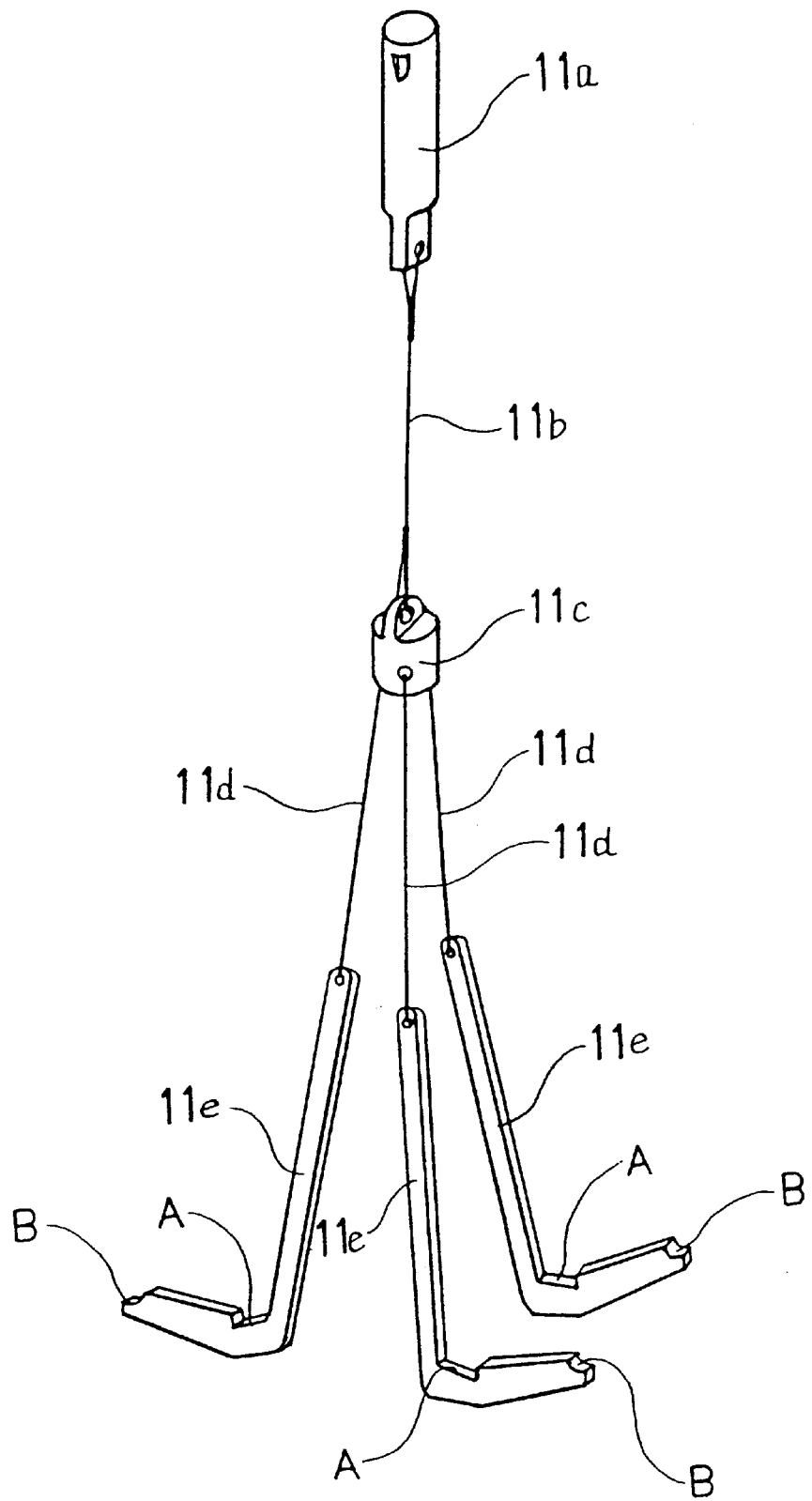
FIG. 2 is a perspective view showing a regulating cylinder-installing jig developed in accordance with this invention.
Figure 3:
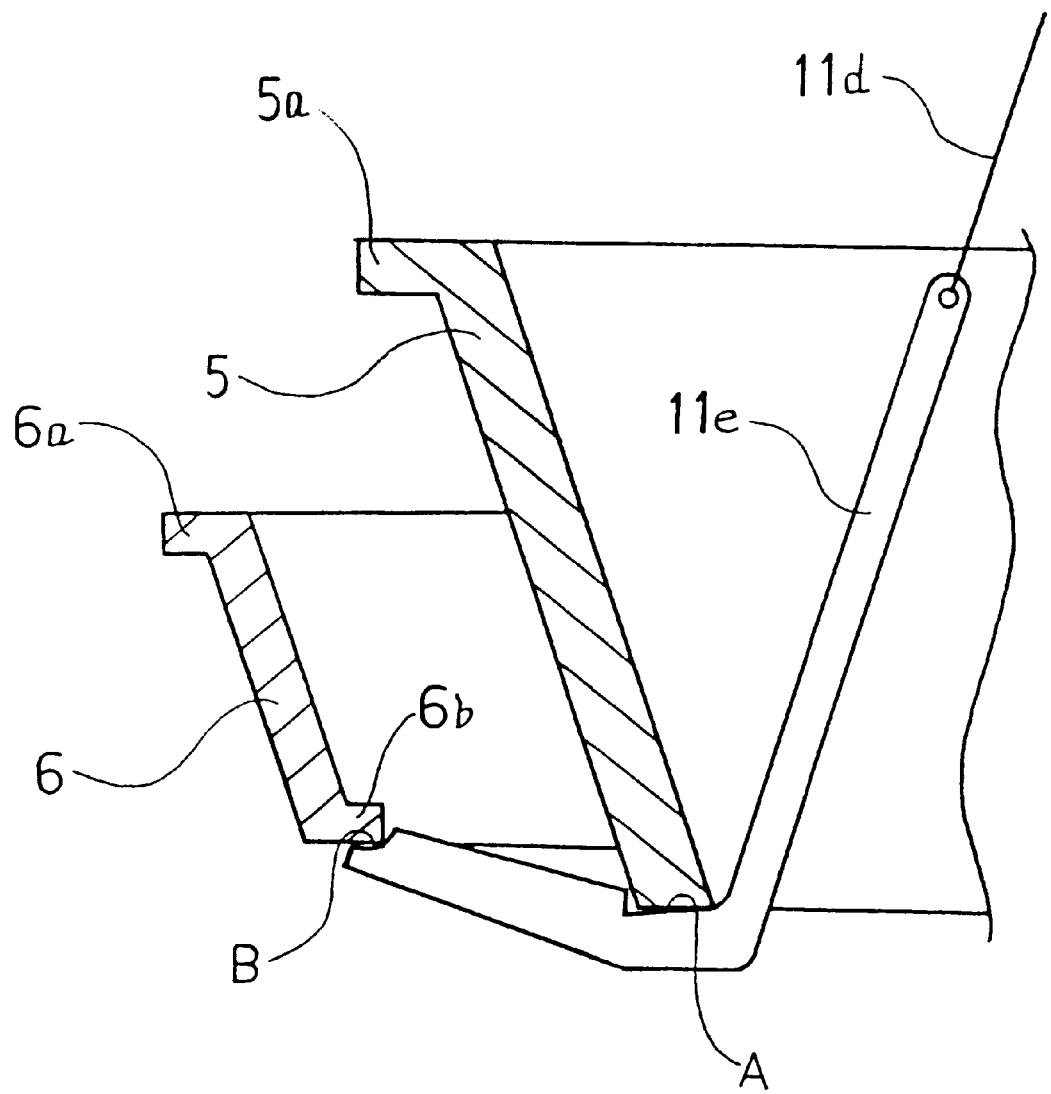
FIG. 3 is an enlarged cross-sectional view showing the situation when the regulating cylinders are being suspended.
Figure 4:
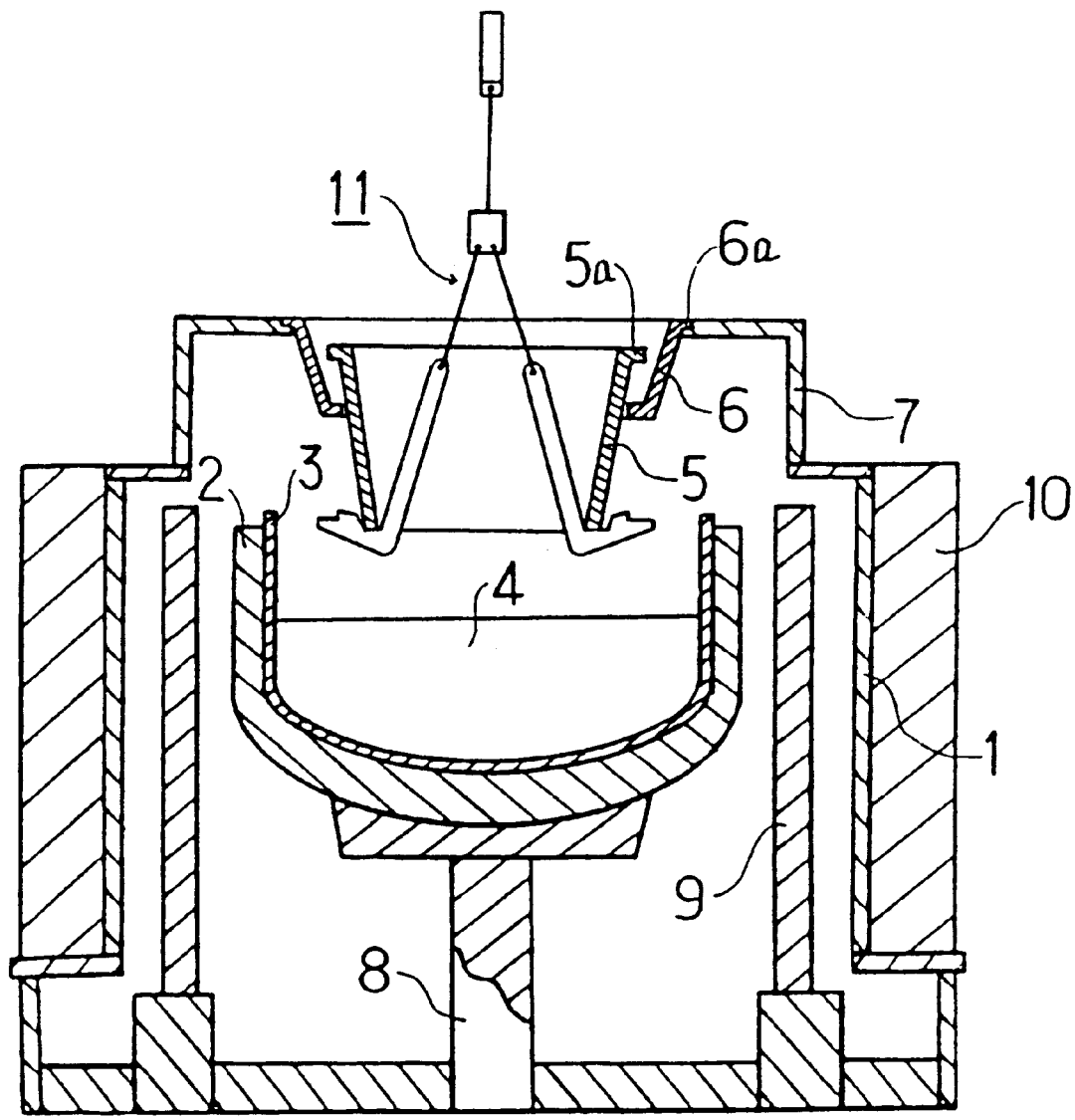
FIG. 4 is a schematic drawing showing the position when the regulating cylinders are being installed.
Figure 5:
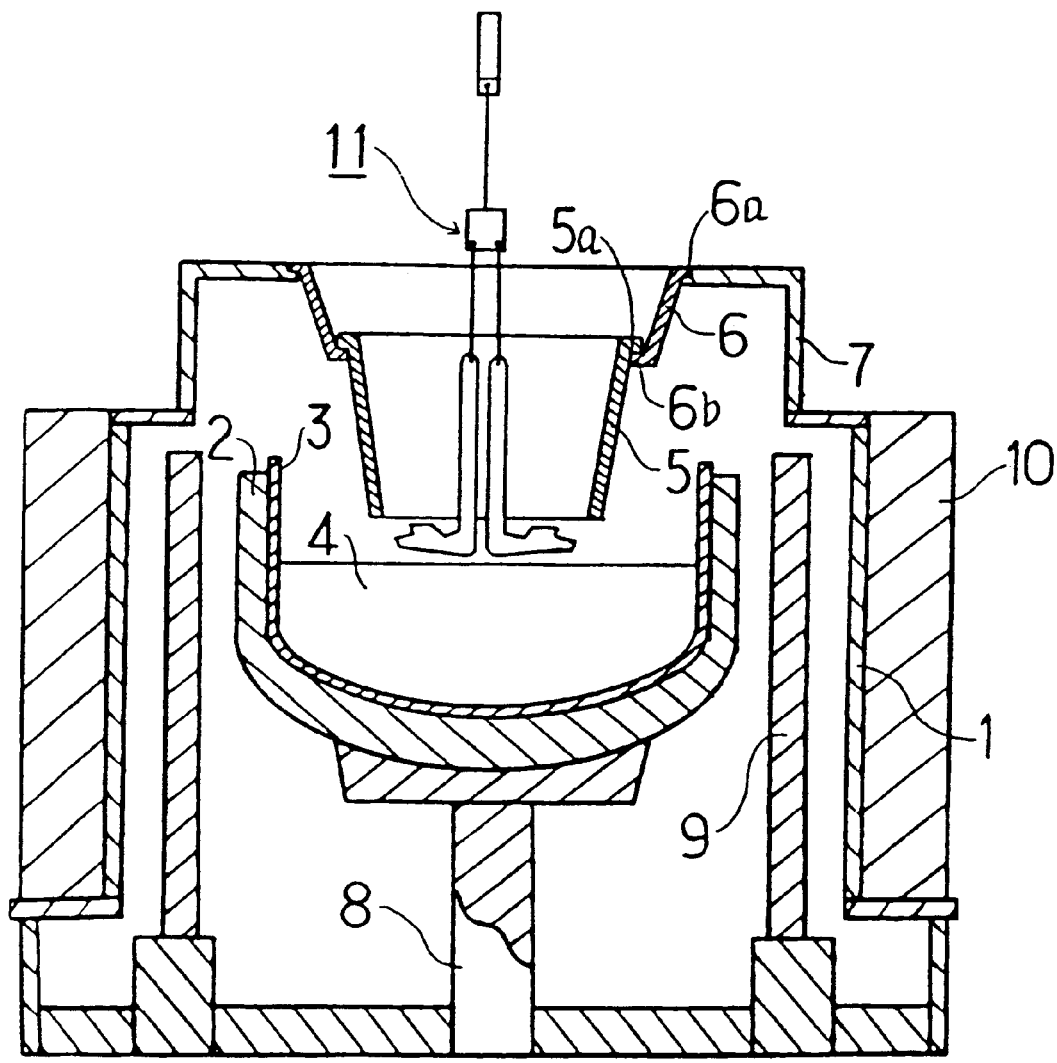
FIG. 5 is a schematic drawing showing the situation when the regulating cylinders have been installed.
Figure 6:
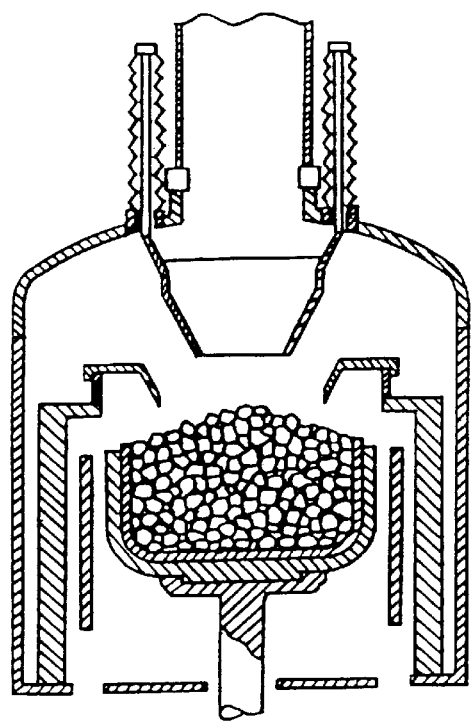
FIG. 6 is a cross-sectional view showing the interior of a single-crystal pulling apparatus utilizing conventional technology.
Figure 7:
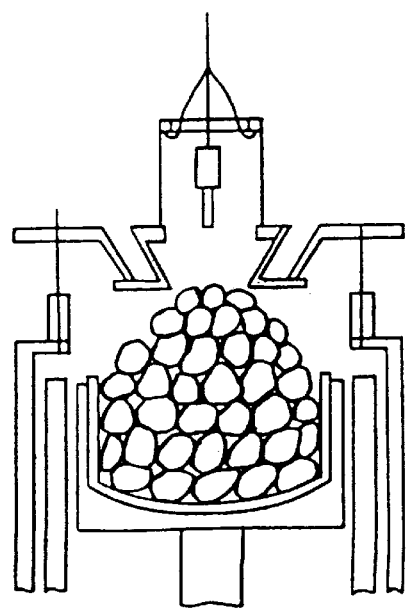
FIG. 7 is a cross-sectional view showing the interior of a single-crystal pulling apparatus utilizing another conventional technology.

The following is a description of an embodiment according to the present invention. FIG. 1 is a schematic drawing showing the situation prior to the installation regulating cylinders on to a device for lifting single crystals. FIG. 2 is a perspective view showing a regulating cylinder-installing jig according to this invention. FIG. 3 is an enlarged cross-sectional view showing the situation when the regulating cylinders are being suspended. FIGS. 4 and 5 are schematic drawings showing the situation upon installation of the regulating cylinders.

FIG. 1 is a drawing showing the interior structure of a device for lifting semiconductor single crystals, and is used to illustrate the structure of the device and the situation prior to the installation of regulating cylinders onto the device.

A quartz crucible 3 is embedded within a graphite crucible 2 that is installed with the main chamber (not shown), and polycrystalline silicon (the raw material of silicon single crystals) is fed into the quartz crucible 3 for melting. In FIG. 1, reference numerals 5, 6 and 7 designate regulating cylinders (heat shielding cylinders) concentrically surrounding the single crystal in single-crystal lifting zone; these regulating cylinders 5, 6, 7 are used to increase the lifting speed of single crystals and to avoid single-crystal dislocation induced by impurity contamination. The regulating cylinders are divided into three parts, regulating cylinder 7 shaped essentially like a cylinder and installed on the heat shield cylinder 1; a first regulating cylinder 5 and a second regulating cylinder 6 which are shaped like reversed truncated cones with different diameters and are capable of engaging with the third regulating cylinder 7. In addition, the regulating cylinders 6, 7 are brought together in accordance with a preset ordering, that is, a flange 6a formed at the outer peripheral rim of the upper end of the second regulating cylinder 6 (outer cylinder) is engaged with a stepped portion 7a of the third regulating cylinder 7, and a flange 5a formed at the outer peripheral rim of the upper end of the first regulating cylinder 5 (inner cylinder) is engaged with a flange 6b formed at the inner peripheral rim of the lower end of the second regulating cylinder 6 (outer cylinder). Furthermore, if the third regulating cylinder 7 covering the above space of a heater 9 is divided in such a way that it remains unmoved when the other two regulating cylinders are lifted upward, the amount of electric power and time required by melting operations can be reduced. Moreover, the numeral 8 denotes the crucible shaft, the numeral 9 denotes the heater, and the numeral 10 denotes the adiabatic cylinder.

Instead of a seed crystal, a regulating cylinder-installing jig 11 is installed within a seed chuck (not shown) that is disposed above the main chamber. As shown in FIG. 2, the regulating cylinder-installing jig 11 consists of a dummy seed 11a made of a heat endurance metal such as Molybdenum alloy or ceramic and capable of being removably fixed to a seed chuck; a wire 11b made of a heat endurance metal such as Tungsten and connected to the lower end of the dummy seed 11a; a connecting member 11c connected to the dummy seed 11a via the wire 11b; three wires 11d made of Tungsten and connected to the lower end of the connecting member 11c; and three hooks 11e made of heat Molybdenum alloy or ceramic and each connected to the lower end of each wire 11d. Two recessed portions A, B are respectively formed on each hook 11e. The recessed portions A, B are respectively employed for retaining the lower ends of the first regulating cylinder 5 and the second regulating cylinder 6. By this arrangement, the first regulating cylinder 5 and the second regulating cylinder 6 can be suspended within the main chamber.

In the situation as represented in FIG. 1, adequate clearance between the upper end of the quartz crucible 3 and the lower end of the first regulating cylinder 5 can be guaranteed. Accordingly, when feeding polycrystalline silicon 4 into the quartz crucible 3, the predetermined amount of the polycrystalline silicon 4 required to be fed can be done so without any deficiency. After the polycrystalline silicon 4 has been fed into the quartz crucible 3, the polycrystalline silicon 4 is heated to a melted liquid by the heater 9. At the time the polycrystalline silicon 4 has essentially become a melted liquid, the crucible axis 8 is driven to lower the quartz crucible 3. At the same time, the seed chuck is gradually lowered. Then, the flange 6a formed at the outer peripheral rim of the upper end of the second regulating cylinder 6 is guided to engage with the stepped portion 7a of the third regulating cylinder 7. After the seed chuck is lowered further, the lower end of the second regulating cylinder 6 is released from the hooks 11e. As shown in FIG. 5, if the seed chuck is lowered much more, then the flange 5a of the first regulating cylinder 5 engages with the flange 6b of the second regulating cylinder 6, as well as the lower end of the first regulating cylinder 5 is released from the hooks 11e. Accordingly, at this time, the seed chuck stops descending, and the whole regulating cylinder-installing jig 11 is raised. Namely, the hooks 11e, which is released from the lower end of the first regulating cylinder 5 due to the descending of the seed chuck, is converged at a location below the connecting member 11c. Therefore, the hooks 11e can be raised through the hollow portion of the first regulating cylinder 5. Thereafter, the lowered quartz crucible 3 ascends to its original location.

By installing the regulating cylinders 5, 6 and 7 disposed around the single crystal being lifted, the heat radiating from the melted liquid and the heater 9 onto the single crystal can be shielded during the lifting operation of the single crystal. Therefore, the lifting speed of the single crystal can be increased and single-crystal dislocation induced by impurity contamination can be avoided.

The structure of this invention has been described as above, and its advantages are as follows.

(1) Although the divided regulating cylinders which obstruct the process of feeding and melting the polycrystalline silicon are suspended at one jig, each regulating cylinder is independently retained. Therefore, installation is very easy and friction that occurs between the regulating cylinders can be eliminated to prevent impurities from entering into the melted liquid during the installation process.

(2) The regulating cylinders are separately installed, and therefore there are no restrictions involved with laying on the dividing sites of the regulating cylinders, thus the design of regulating cylinders can be more freely pursued.

(3) A third regulating cylinder covering the above space of the heater is separately divided in such a way that it remains unmoved when the other two regulating cylinders are lifted upwards. Therefore, the amount of electric power and time required by melting operations can be reduced.

What is claimed is:

1. A regulating cylinder unit for a semiconductor single-crystal pulling apparatus, comprising:
   a first regulating cylinder;
   a second regulating cylinder, said first and second regulating cylinders concentrically surrounding a semiconductor single crystal within said semiconductor single-crystal pulling apparatus; and
   first engaging means for engaging a lower end of said second regulating cylinder with an upper end of said first regulating cylinder.

2. A regulating cylinder unit as claimed in claim 1, wherein said first engaging means comprises a flange formed at an inner peripheral rim of the lower end of said second regulating cylinder and a flange formed at an outer peripheral rim of the upper end of said first regulating cylinder.

3. A regulating cylinder unit as claimed in claim 1, further comprising a third regulating cylinder concentrically surrounding the semiconductor crystal within said semiconductor single-crystal pulling apparatus, said third regulating cylinder covering an above space of a heater of said semiconductor single-crystal pulling apparatus;

wherein said third regulating cylinder remains unmoved when said first and second regulating cylinders are lifted upward.

4. A regulating cylinder unit as claimed in claim 3, comprising a plurality of regulating cylinders.

5. A regulating cylinder unit as claimed in claim 3, further comprising second engaging means for engaging an upper end of said second regulating cylinder with an inner end of said third regulating cylinder.

6. A regulating cylinder unit as claimed in claim 3, wherein said second engaging means comprises a flange formed at an outer peripheral rim of an upper end of said rectifying second cylinder and a flange formed at a stepped portion of an inner end of said third regulating cylinder.

7. A regulating cylinder-installing jig which is used to install at least a first and a second regulating cylinder, comprising:

a dummy seed capable of being removably fixed to a seed chuck, and a plurality of hooks swingably suspended at a lower end of said dummy seed via wires;

wherein each hook has at least two engage portions that retain a lower end of each regulating cylinder at each preset location.

\* \* \* \* \*